(12) United States Patent
Alexander et al.

(10) Patent No.: US 7,196,906 B1
(45) Date of Patent: Mar. 27, 2007

(54) CIRCUIT BOARD HAVING SEGMENTS WITH DIFFERENT SIGNAL SPEED CHARACTERISTICS

(75) Inventors: Arthur R. Alexander, Valley Center, CA (US); James L. Knighten, Poway, CA (US); Jun Fan, San Marcos, CA (US); Norman W. Smith, San Marcos, CA (US)

(73) Assignee: NCR Corp., Dayton, OH (US)

( * ) Notice: Subject to any disclaimer, the term of this patent is extended or adjusted under 35 U.S.C. 154(b) by 244 days.

(21) Appl. No.: 10/641,476

(22) Filed: Aug. 15, 2003

(51) Int. Cl.
*H05K 7/02* (2006.01)
(52) U.S. Cl. .................................... 361/760
(58) Field of Classification Search ................ 361/780, 361/794, 764, 793, 783, 760; 174/262
See application file for complete search history.

(56) References Cited

U.S. PATENT DOCUMENTS

| | | | | |
|---|---|---|---|---|
| 5,072,075 A | * | 12/1991 | Lee et al. .................... | 174/264 |
| 5,912,809 A | * | 6/1999 | Steigerwald et al. ........ | 361/780 |
| 6,509,529 B2 | * | 1/2003 | Kamath et al. .............. | 174/255 |
| 6,603,668 B2 | * | 8/2003 | Iwanami ...................... | 361/794 |
| 6,828,514 B2 | * | 12/2004 | Chan et al. .................. | 174/262 |
| 2004/0150970 A1 | * | 8/2004 | Lee ............................. | 361/794 |

OTHER PUBLICATIONS

U.S. Appl. No. 10/145,436, filed May 14, 2002, Alexander et al.
U.S. Appl. No. 10/274,573, filed Oct. 21, 2002, Alexander et al.

* cited by examiner

*Primary Examiner*—Dean A. Reichard
*Assistant Examiner*—Yurity Semenenko
(74) *Attorney, Agent, or Firm*—Trop, Pruner & Hu; Harden E. Stevens, III

(57) ABSTRACT

A circuit board includes multiple segments, with a first segment having plural signal layers and a second segment having plural signal layers. Signal paths provided by signal layers of the first segment exhibit higher speed signal transmission capability than signal paths provided by the signal layers of the second segment.

12 Claims, 4 Drawing Sheets

CIRCUIT BOARD HAVING SEGMENTS WITH DIFFERENT SIGNAL SPEED CHARACTERISTICS

BACKGROUND

A circuit board (sometimes referred to as a printed circuit board or a printed wiring board) is the basic building block for interconnecting electronic devices in a system. Electronic devices, usually integrated circuit (IC) devices, are mounted onto the circuit boards using a number of mounting mechanisms, such as by use of connectors or by directly mounting the devices onto a surface of the circuit board. A circuit board includes the wiring required to interconnect the devices electrically, and the circuit board also provides the primary support for the devices.

A circuit board typically includes multiple layers, which can range from two layers to fifty or more layers, as examples. Some layers are used for signal transmission, while other layers are used for power and ground reference planes. A reference plane is a plane that is connected to a reference voltage, such as ground, a three-volt voltage, a five-volt voltage, or some other power supply voltage. Some reference planes may even be coupled to more than one voltage.

Typically, a transmission line on a circuit board is formed by a signal trace (routed on a signal layer of the circuit board) and a reference plane (that is provided in a reference plane layer of the circuit board). A circuit board is designed to achieve transmission lines with a target characteristic impedance, which is usually 50 ohms or 75 ohms for single-ended lines and 100–150 ohms for differential lines. The characteristic impedance of a transmission line is dependent on several factors: the inductance of the conductors that make up the transmission line, the dielectric medium, the distance to a reference plane, and the capacitance between the conductors.

Vias are used to electrically connect signal traces at different layers. A via is an electrical connection that is run through multiple layers of the circuit board to complete a signal path using two or more routing layers. Typically, the via is run generally perpendicularly to the main surface of the circuit board. In forming a via, some amount of dielectric material is removed by drilling, laser, or other methods. Next, an electrically conductive metal, usually copper, is flowed or plated into the void to provide the electrical connection between signal lines at different layers.

To avoid shorting problems, minimum clearances are defined between each via and the surrounding signal wires or reference planes. To maximize the density of wires that can be run through each layer of the circuit board, it is desirable for the spacing between the signal lines and a via to be the minimum possible while still avoiding short-circuit problems. Conventional circuit board design and manufacturing methods require minimum clearance dimensions to be maintained equally on all board layers, regardless of whether the layer is a signal layer or a power reference layer.

Because vias are configured differently than signal traces, the characteristic impedance of a via is often different than that of a transmission line. Usually, the characteristic impedance of a via is less than the characteristic impedance of a signal transmission lines on the circuit board. As a result, if a signal path is routed through one or more vias between different layers of the circuit board, impedance discontinuities are introduced by the presence of the vias. For signals having low frequencies, the feature dimension of a via is usually much less than a wavelength of each signal. Therefore, such a low-frequency signal usually does not experience effects of impedance discontinuity introduced by the vias. However, as the frequency of the signal increases, the feature dimension of the via becomes a significant portion of, or is even larger than, a wavelength of the signal. The impedance discontinuity introduced by vias along a signal path can cause reflections, which degrades signal quality and performance in a system.

Another factor that degrades signal performance is the presence of stubs formed by unused end portions of vias. A through-hole via extends through multiple signal layers of a circuit board. In a circuit board having many signal layers, it is sometimes the case that a via connects signal traces on two signal layers in close proximity to each other, leaving portion(s) of the via extending to other layers unused. In such a situation, the unused portion(s) of the via form stub(s). The stub(s) cause signal reflections that degrade signal transmission performance.

SUMMARY

In general, methods and apparatus are provided to improve signal transmission performance in a segment of a circuit board. For example, a circuit board includes a plurality of segments, with a first segment including a plurality signal layers and a second segment including a plurality signal layers. Signal paths provided by the signal layers of the first segment exhibit higher speed signal transmission capability than signal paths provided by the signal layers of the second segment.

Other or alternative features will become more apparent from the following description, from the drawings, and from the claims.

DETAILED DESCRIPTION

In the following description, numerous details are set forth to provide an understanding of the present invention. However, it will be understood by those skilled in the art that the present invention may be practiced without these details and that numerous variations or modifications from the described embodiments are possible.

Figure 1:
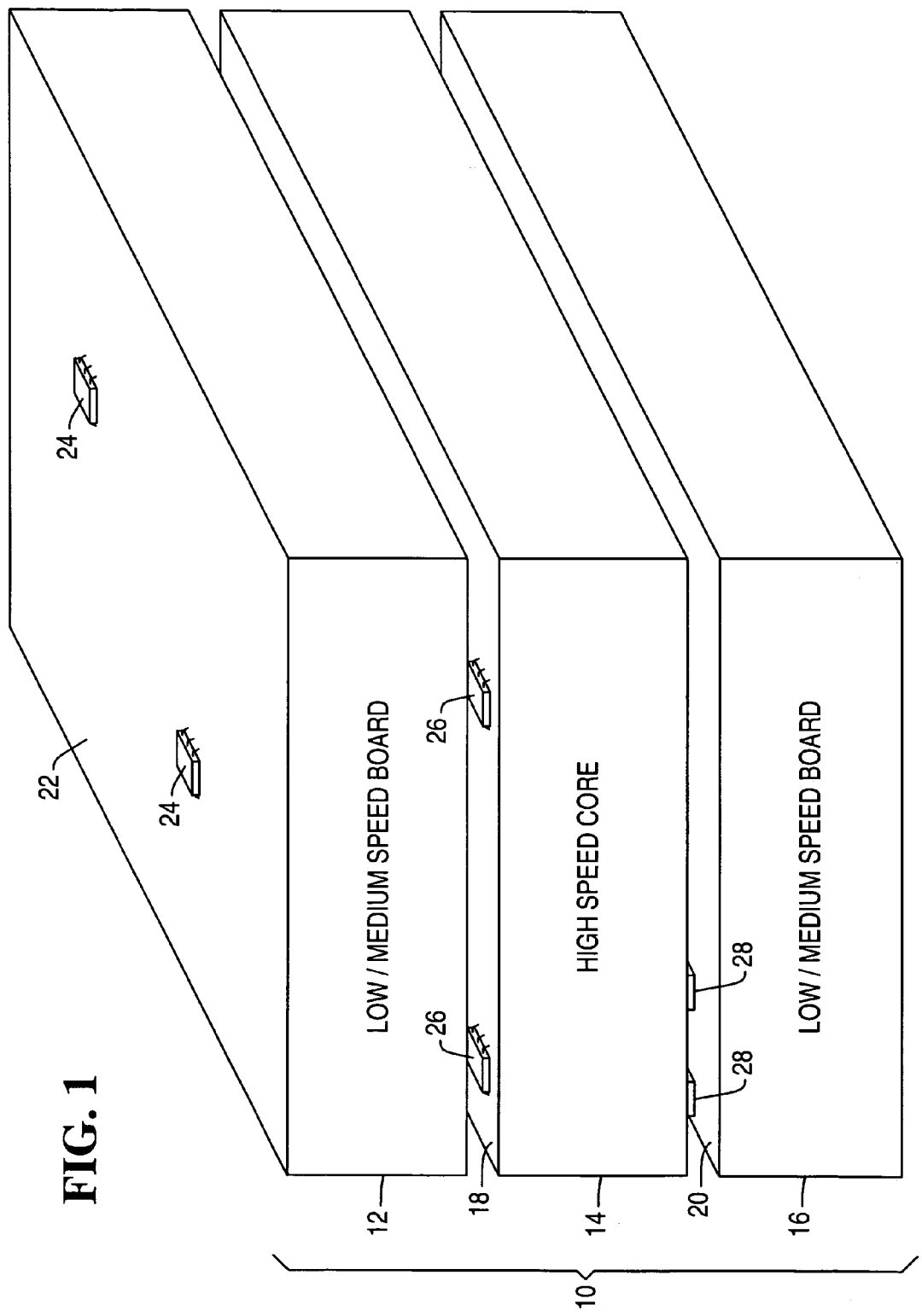
FIG. 1 illustrates an example arrangement of a circuit board.

As shown in FIG. 1, an example circuit board 10 includes multiple segments, with a first segment being a low/medium-speed board 12, a second segment being a high-speed core 14, and a third segment being a low/medium-speed board 16. As used here, a "circuit-board" refers to any structure containing signal wires or conductor (for routing signals) and containing reference planes (to carry ground and power supply voltages). Examples of circuit boards (are printed wiring boards (PWBs), also referred to as printed circuit boards (PCBs). A circuit board also includes any package, such as an integrated circuit (IC) package, that has multiple layers of signal wires or conductors and power or ground reference planes.

The terms "low-speed," "medium-speed," and "high-speed" are relative terms to refer to the relative signal transmission capabilities of the various segments of the circuit board 10. Thus, the high-speed core 14 has a higher speed signal transmission capability than the low/medium-speed boards 12 and 16. The term "signal transmission capability" of a circuit board segment refers to the performance of the circuit board segment in transmitting or communicating signals at relatively high frequencies from one point to another point.

The characteristics of certain segments of the circuit board 10 enable better performance at higher frequencies than other segments of the circuit board 10. Thus, for example, the high-speed core 14 has certain characteristics to enable it to provide superior performance at higher frequencies. With its high-speed characteristics, the high-speed core 14 is able to support transmission of signals with rise or fall times of short duration (fast rise or fall times). One such high-speed characteristic is the use of dielectric layers with lower dielectric constants (Dk) and a lower (and constant) loss tangent for lower dielectric losses. This enables thinner dielectric layers to be used in the high-speed core 14, which reduces the overall thickness of the high-speed core. The reduced thickness of a dielectric layer between the signal, power, and ground planes also enable shorter vias to be used in the high-speed core. A via is an electrical structure that electrically connects lines or components at different layers of a circuit board. Use of shorter vias result in shorter stub lengths and thus reduced signal reflections. The lower dielectric constants also enable wider signal trace widths; hence, lower skin effect losses are incurred during signal transmission.

Another enhanced characteristic of the high-speed core 14 is the use of buried vias within the high-speed core such that buried vias do not extend to the low/medium-speed boards 12 and 16. By not extending the buried vias into the surrounding low/medium-speed boards, stubs can be avoided or reduced to reduce signal reflection problems. The buried vias allow for local connection of signal traces within different layers of the high-speed core 14.

The high-speed core 14 and the low/medium-speed boards 12 and 16 are fabricated as separate segments. During fabrication of each of these segments, through-hole vias are formed through each of the segments to provide desired connections to signal traces or to a reference plane. Once the three segments 12, 14, and 16 are assembled, the vias in the high-speed core 14 become buried vias of the overall circuit board 10, while the vias in the segments 12 and 16 become "blind" vias, which are vias that extend from an outer layer (near an upper or lower surface of the circuit board 10) to an inner layer. After assembly of the segments 12, 14, and 16, through-hole vias can be drilled from one outer layer of the circuit board 10 to another outer layer of the circuit board. Thus, several different types of vias can be present in the circuit board 10: buried vias, blind vias, and through-hole vias.

A further characteristic of the high-speed core 14 that provides improved high-frequency operation is that the impedance of the vias within the high-speed core 14 is matched or tailored as closely as possible to the impedance of a signal transmission line in the circuit board 10. Example target transmission line impedances include 50 ohms or 75 ohms for single-ended lines or 100–150 ohms for differential lines. As noted above, tailoring of the via impedance reduces signal path impedance discontinuity. Tailoring of the via impedance to the signal transmission line impedance can be accomplished by tailoring the size of clearances or anti-pads around a via at power or ground planes. This is described further below.

As further shown in FIG. 1, integrated circuit (IC) devices 24 are mounted onto the upper outer surface 22 of the circuit board 10. Examples of IC devices 24 include processors, memory devices, peripheral devices, bridge controllers, communications link interfaces, and so forth. Pins from the IC devices 24 are electrically connected to signal traces in an outer signal layer for routing to different parts of the circuit board 10. A signal can be routed through multiple layers, in which case vias are used to electrically connect signal traces at different layers.

In accordance with some embodiments of the invention, embedded IC devices 26 can also be mounted at an upper surface of the high-speed core 14. The IC devices 26 are positioned in a space in which an insulation layer 18 is provided. The insulation layer 18 provides the insulation between the high-speed core 14 and the outer board 12. As an example, the insulation layer 18 is formed of a B-stage or prepeg (pre-impregnated) material. During fabrication of the circuit board 10, after formation of the high-speed core 14 and the low/medium speed board 12, the IC devices 26 are mounted to the upper surface of the high-speed core 14. Then, the insulation layer 18 is added between the high-speed core 14 and a low/medium-speed board 12 by a reflow process. The B-stage or prepeg material is inserted between the high-speed core 14 and the low/medium speed board 12, and the assembly is heated to the temperature that the B-stage or prepeg material reflows to fill in the gap between the two already built boards 14 and 12.

Embedded IC devices 28 can also be provided at the lower surface of the high-speed core 14. The devices 28 are positioned in a space in which an insulation layer 20 is provided. The insulation layer 20 provides the insulation between the high-speed core 14 and the other outer board 16. Mounting of the devices 28 and formation of the insulating layer 20 are performed in a manner that is similar to mounting of IC devices 26 and formation of the insulating layer 18 discussed above.

Figure 2:
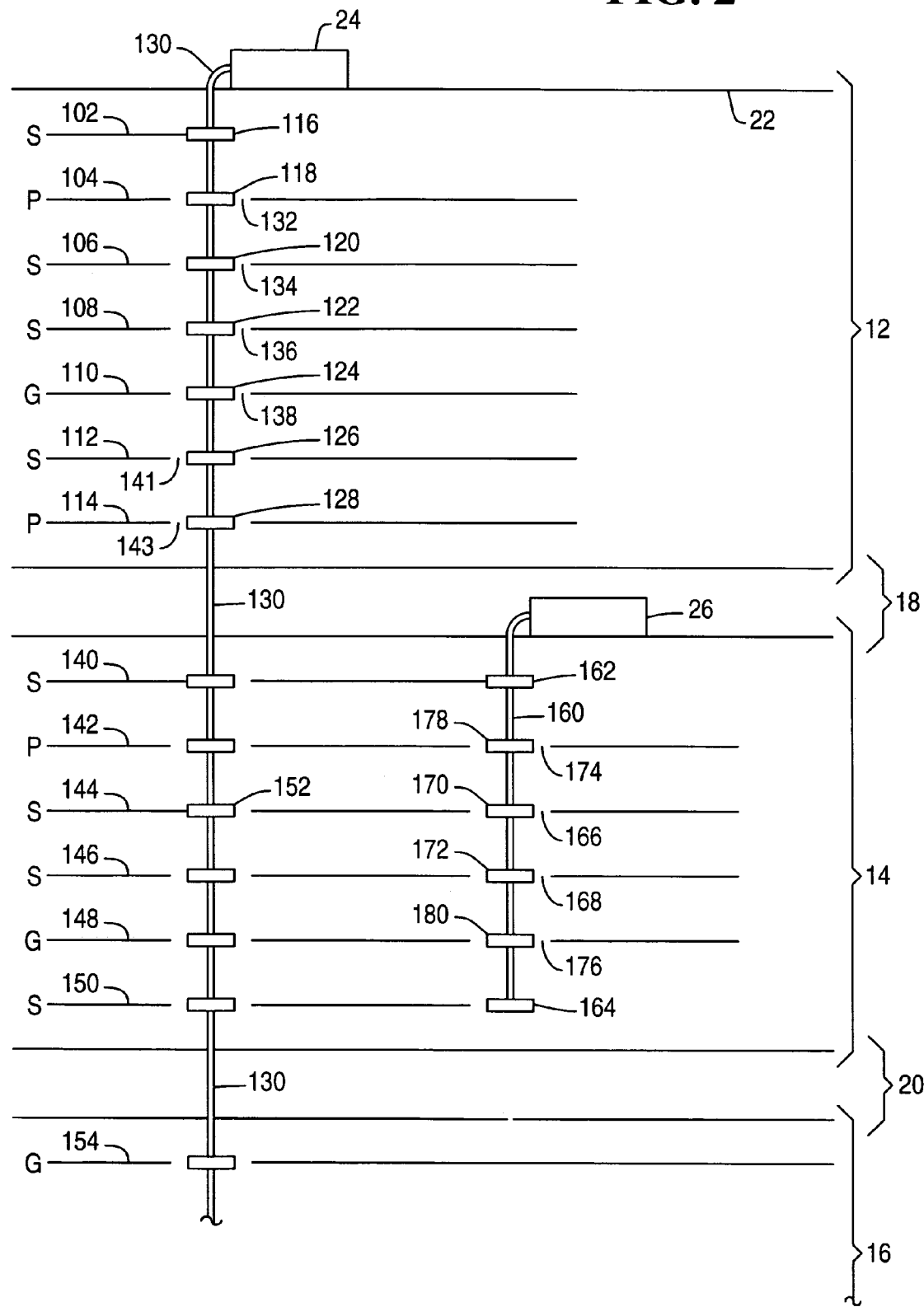
FIG. 2 is a side view of several layers of the circuit board of FIG. 1.

FIG. 2 illustrates various layers in the segments of the circuit board 10. The first segment 12 (low/medium-speed board) has the following sequence of layers (starting near the upper surface 22): signal (S) layer 102, power (P) layer 104, signal layers (S) 106 and 108, ground (G) layer 110, signal layer (S) 112, and power layer (P) 114.

A through-hole via 130 is provided through the various layers of the first segment 12. Note that the via 130 also extends through layers of the second segment 14 (high-speed core) as well as through layers of the third segment 16 (low/medium-speed board). At each layer, the via 130 is electrically contacted to a pad (pad 116 at signal layer 102, pad 118 at power layer 104, pad 120 at signal layer 106, pad 122 at signal layer 108, pad 124 at signal ground layer 110, pad 126 at signal layer 112, and pad 128 at power layer 114).

A signal trace at the signal layer 102 is electrically contacted to the pad 116 to provide electrical connection between the signal trace and via 130. The other layers of the first segment 12 are not electrically connected to the via 130. Therefore, clearances (or anti-pads) are provided around respective pads at each of the layers. Clearance 132 is provided around pad 118 at the power layer 104, clearance 134 is provided around pad 120 at the signal layer 106, clearance 136 is provided around pad 122 at the signal layer 108, clearance 138 is provided around the pad 124 at the ground layer 110, clearance 141 is provided around the pad 126 at the signal layer 112, and clearance 143 is provided around pad 128 at power layer 114.

Note that the arrangement shown in FIG. 2 is provided as an example only. In other arrangements, a greater or smaller number and different order of layers can be provided in the first segment 12, as well as in the other segments of the circuit board 10, including different numbers of signal and power planes.

The via 130 extends through the insulating layer 18 between circuit-board segments 12 and 14 and through the layers of the second segment 14. An example sequence of the layers of the second segment 14 include a signal layer 140, a power layer 142, signal layers 144 and 146, a ground layer 148, and a signal layer 150. Again, at each of the layers of the second segment 14, pads are provided that are electrically contacted to the via 130. In the second segment 14, a signal trace at the signal layer 144 is electrically connected to the pad 152 that is in turn electrically contacted to the via 130. In this manner, the signal trace at the signal layer 144 in the high-speed core 14 is electrically connected to a signal trace in the signal layer 102 of the low/medium-speed board 12. At the other layers of the high-speed core 14, clearances are provided around respective pads that are electrically contacted to the via 130.

The via 130 further extends through the insulating layer 20 and into the third segment 16 of the circuit board 10. The first layer of the circuit board segment 16 that is nearest the high-speed core 14 is a ground (G) layer 154.

The high-speed core 14 also includes a buried or embedded via 160. In the example of FIG. 2, a pin of the embedded IC device 26 is electrically contacted to a pad 162 that is electrically contacted to the via 160 at the signal layer 140. A signal trace in the signal layer 140 is electrically contacted to the pad 162. The via 160 extends through layers 142, 144, 146, and 148 to the signal layer 150 (all in the high-speed core 14). A signal trace in the signal layer 150 is electrically contacted to a pad 164, which is in turn electrically contacted to the via 160. Clearances 166 and 168 are defined around respective pads 170 and 172 at signal layers 144 and 146. However, in accordance with some embodiments of the invention, to tailor the impedance of the via 160 to match as closely as possible the signal transmission line impedance of the circuit board, larger clearances 174 and 176 are provided around pads 178 and 180 at power and ground layers 142 and 148, respectively.

Figure 3:
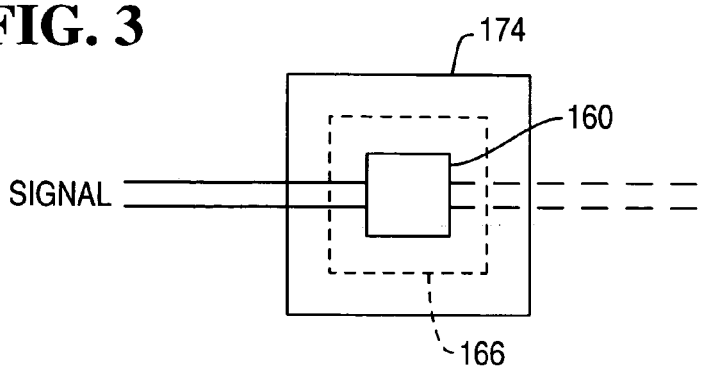
FIG. 3 is a top view to show the different dimensions of clearances at a signal layer and at a reference plane layer of the circuit board.

The increased clearances 174 and 176 at the reference plane layers allows the impedance of the via 160 to be increased, due to the increased distance between the via 160 and the power reference plane conductor. A top view of the different sizes of the clearance at the reference plane layers and at the signal layers is shown in FIG. 3. Although shown as being rectangular in shape, the clearances can have other shapes, such as elliptical, round, and so forth.

Also, although reference is made to increasing the impedance of a via in some embodiments, it is contemplated that the impedance of a via can also be decreased to reduce impedance discontinuity between a signal transmission line and the via. Thus, more generally, the impedance of the via is adjusted or tailored to reduce impedance discontinuity between a signal transmission line and a via. Reducing impedance discontinuity refers to reducing the difference in impedances of the signal transmission line and the via.

Figure 4:
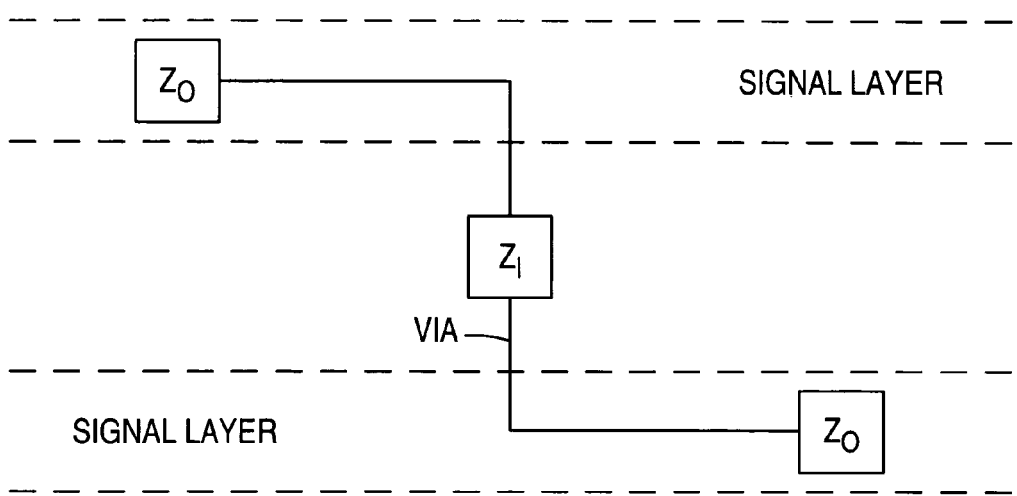
FIG. 4 is a schematic diagram of a signal path in the circuit board of FIG. 1.

Schematically, the impedance of a signal transmission line in each signal layer is represented as $Z_o$, as shown in FIG. 4. FIG. 4 shows two signal transmission lines at two signal layers of the circuit board 10. FIG. 4 also shows the via as having a characteristic impedance $Z_i$. The via can be thought of as being a separate transmission line (with characteristic impedance $Z_i$) that is cascaded with signal transmission lines each with characteristic impedance $Z_o$.

Figure 5:
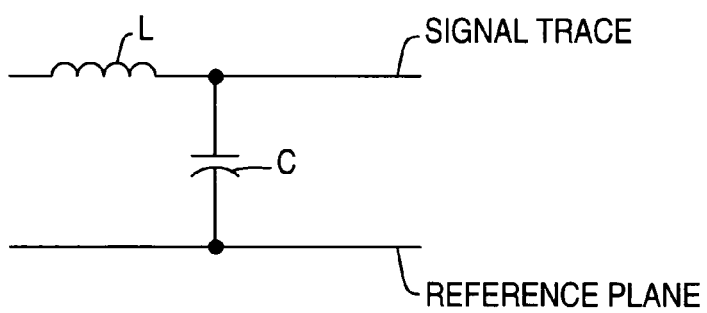
FIG. 5 is a schematic diagram of a transmission line.

As used here, a "signal transmission line" refers to a transmission line formed by the combination of a signal trace in a signal layer, a reference plane, and a dielectric layer between the signal trace and reference plane with a capacitance C. This is depicted in FIG. 5, which also depicts an inductance (L) in series with the signal line for a lossless line. Similarly, a "via transmission line" refers to a transmission line formed by the combination of a via, one or more reference planes, and the dielectric between the via and the one or more reference planes.

A transmission line can be a parallel-plate transmission line or a two-wire transmission line. In either case, the characteristic impedance of a transmission line is derived from the inductance (L) and capacitance (C) of the transmission line:

$$Z_0 \cong \sqrt{\frac{L}{C}}.$$

The inductance of a signal transmission line is dependent upon the width and thickness of the signal trace and the distance of the signal trace to the reference plane. The capacitance of the signal transmission line is dependent upon the spacing between the plates (the spacing between the signal trace and the reference plane), the type of dielectric between the signal trace and the reference plane, and the width of the signal trace. A circuit board is designed so that each signal transmission line has a target characteristic impedance, such as of 50 ohms, 75 ohms, or another target characteristic impedance.

However, due to its different arrangement, a via usually has a different impedance, which results in impedance discontinuity between the via transmission line and the signal transmission line. To avoid as much as possible the problem of reflections of signals transmitted over a signal path that includes one or more signal transmission lines and one or more via transmission lines, it is desired to match as closely as possible the impedance of the via transmission line to the impedance of the signal transmission line.

As noted above, this is accomplished by increasing the clearance between the via and certain power reference planes through which the via passes. Increasing the clearance between a via and a reference plane causes the effective capacitance of the via transmission line to be decreased so that the via characteristic impedance is increased. The increase in clearance is not provided at any signal layer so that routing space in the signal layer is not reduced. Thus, in accordance with some embodiments of the present invention, the impedance of a via can be tailored without sacrificing routing space at a signal layer in the high-speed core 14. Also, the via impedance can be tailored without sacrificing electrical charge or current carrying capacity at selected power reference planes.

The tailored via clearances around a via at a reference plane layer can be implemented just for signal paths over which high-frequency signals are expected. Thus, for low-frequency signal paths, the clearances around a via can be the same at signal layers and reference plane layers. Also, tailoring of via impedances can optionally also be provided in the low/medium-speed segments 12 and 16.

In addition to tailoring impedances of vias in the high-speed core, another characteristic of the high-speed core 14 to enhance high-speed performance is the use of dielectric layers with lower dielectric constants than dielectric layers in the segments 12 and 16. The dielectric layers are provided between each pair of layers in the high-speed core 14. Thus, a dielectric layer is provided between the signal layer 140 and the power layer 142 (FIG. 2), a dielectric layer is provided between the power layer 142 and the signal layer 144, and so forth.

Dielectric layers are also provided between layers in the other low/medium-speed segments 12 and 16. Examples of the dielectric material that can be used in the dielectric layers in the low/medium-speed segments 12 and 16 include an epoxy-based material (e.g., FR-4, etc.). Examples of the dielectric material that can be used for dielectric layers in the high-speed core 14 include polytetrafluoroethylene (PTFE) (e.g., TEFLON® or other suitable materials that have lower dielectric constants than the dielectric material used in the low/medium-speed segments 12 and 16.

The lower dielectric constant materials used in the high-speed core 14 may be more expensive than the dielectric material used in the lower-speed segments 12 and 16. Thus, by limiting use of the more expensive material to the high-speed core 14, the increase in cost of fabricating a circuit board with high-frequency performance can be controlled. By using a dielectric layer having a lower dielectric constant in the high-speed core 14, the thickness of the dielectric layers can be reduced (when compared to the dielectric layers used in the lower-speed segments 12 and 16). As a result, the overall thickness of the high-speed core 14 can be reduced to provide shorter vias for improved high-frequency signal transmission performance.

By using the buried via 160 in the high-speed core 14, a substantial reduction of stub formed by an unused portion of the through-hole via can be accomplished. For example, comparison can be made between the via 130 and the buried via 160. The via 130 electrically connects a signal trace at the signal layer 102 and a signal trace at the signal layer 144. The unused portion of the via 130 below the signal layer 144 forms a stub that can cause signal reflections. In contrast, the via 160, which electrically connects signal traces at layers 140 and 150 in the high-speed core 14, is associated with no stub or a very small amount of stub. Even if the via 160 electrically connects signal traces at layers 140 and 144 (and not connected to signal traces at other layers 146 and 150 in the high-speed core 14), the amount of stub that is formed below the signal layer 144 is much smaller than the stub that is present in the via 130. This substantially reduces signal reflections at high-frequency signal operations in the high-speed core 14.

If the number of through-hole vias that have to be drilled through the high-speed core 14 is relatively large, then the amount of electrical conductor (e.g., copper) remaining in the reference planes (power layer 142 and ground layer 148) in the high-speed core 114 can be low. This reduces the current carrying capacity of the reference plane layers 142 and 148. To address this issue, power and ground layers 114 and 154 in the lower-speed segments 12 and 16, respectively, are provided adjacent the high-speed core 14. This enhances the current return for high-speed switching signals in the core 14, since the power and reference planes 114 and 154 are able to carry return current for signals in the core 14.

Also, by providing the power and ground planes 114 and 154 close to the high-speed core 14, improved charge supply for high-speed switching devices is also provided.

Another benefit of providing the power and ground planes 114 and 154 adjacent the high-speed core 14 is improved electromagnetic interference (EMI) containment of radiation from high-speed signals that are transmitted in the high-speed core 14. Also, a benefit of providing the power reference planes 114 and 154 adjacent the high-speed core 14 is improved signal trace characteristic impedance continuity as there is less removal of electrically conductive material from the reference plane layers 114 and 154.

Another benefit of the embodiment shown in FIG. 2 is that the fabrication of blind via (upper surface 22 or lower surface 24 of the circuit board 10 to the core 14) is made less difficult.

Figure 6:
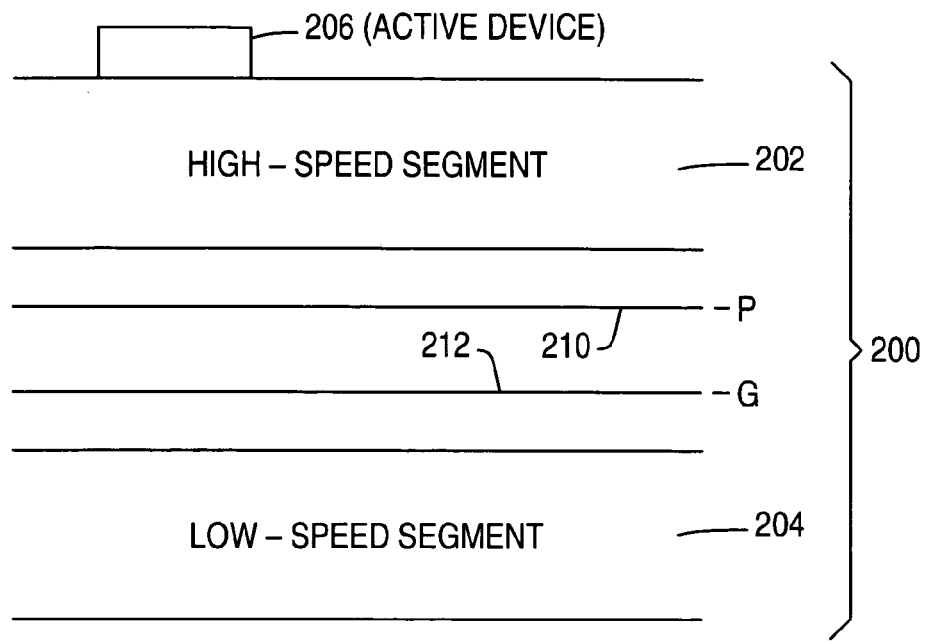
FIG. 6 is a side view of portions of a circuit board according to another embodiment.

FIG. 6 shows another embodiment of a circuit board 200 that includes a high-speed core 202 and a lower-speed segment 204. In this embodiment, the high-speed core 202 is not sandwiched between two lower-speed segments. Instead, the high-speed core 202 is provided as the upper portion of the circuit board 200. Active devices 206 are provided on the upper surface 208 of the high-speed core 202.

In the high-speed core 202, various characteristics are provided to improve high-frequency performance. One is the tailoring of the impedance of signal vias to match signal transmission lines, as described above in connection with the high-speed core 14 of the circuit board 10 shown in FIG. 2. Another optional improved characteristic is the use of dielectric layers with lower dielectric constants in the high-speed core than dielectric layers in the lower-speed segment 204.

The lower-speed segment 204 can be constructed with smaller clearances or anti-pads around vias to enhance return current capacity in the reference plane layers. Also, as shown in FIG. 6, a power layer 210 and a ground layer 212 are provided between the high-speed segment 202 and the low-speed segment 204, which provides good charge supply for high-speed switching active devices and improved current return capacity. By providing the high-speed core 202 as an outer segment, routing of high-speed signals exiting the high-speed segment 202 is made easier.

Figure 7:
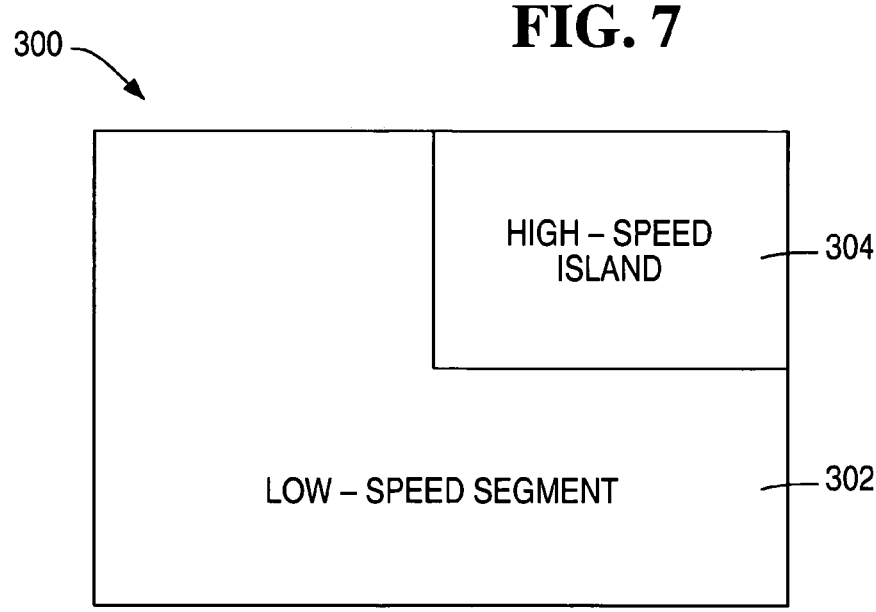
FIG. 7 is a top view of a circuit board according to yet a further embodiment.

FIG. 7 shows yet another embodiment of a circuit board 300. FIG. 7 is a schematic top view of the circuit board 300 that shows a circuit board with a lower-speed segment 302 and a high-speed segment 304. The high-speed segment 304 is an island that is partially surrounded by the low-speed segment 302. In another embodiment, the high-speed island 304 can be provided at other locations of the circuit board 300, including at a location more towards the center of the circuit board 300 when viewed from the top.

In the embodiment of FIG. 7, the number of layers of the high-speed island 304 is the same as the number of layers in the low-speed segment 302. However, the high-speed island 304 is designed to provide superior high-frequency signal performance, by using lower dielectric constant dielectric layers as wells as by tailoring of via impedance to reduce impedance continuity between a via transmission line and signal transmission line.

While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A circuit board comprising:
   a plurality of segments comprising first and second segments, the first segment including plural signal layers and at least one dielectric layer having a first dielectric constant, and the second segment including plural signal layers and at least one dielectric layer having a second dielectric constant, the first and second dielectric constants being different, and
   wherein signal paths provided by the signal layers of the first segment exhibit higher speed signal transmission capability than signal paths provided by the signal layers of the second segments.

2. The circuit board of claim 1, wherein the first segment includes plural dielectric layers having the first dielectric constant, and the second segment includes plural dielectric layers having the second dielectric constant.

3. The circuit board of claim 1, wherein the plurality of segments further comprise a third segment having plural signal layers, and wherein the first segment is embedded between the second and third segments.

4. The circuit board of claim 3, wherein the third segment further includes at least one dielectric layer having the second dielectric constant.

5. The circuit board of claim 3, wherein the first segment further comprises buried vias that extend to the signal layers of the first segment but do not extend to signal layers of the second and third segments.

6. The circuit board of claim 5, further comprising a through-hole via extending through the first, second, and third segments.

7. The circuit board of claim 1, wherein the first segment is provided on one side of the second segment.

8. The circuit board of claim 1, wherein the first segment further includes a reference plane layer, and a via passing through the reference plane layer and at least one signal layer, the first segment further comprising a first clearance defined around the via at the at least one signal layer, and a second clearance defined around the via at the reference plane layer, the second clearance being larger than the first clearance.

9. The circuit board of claim 8, wherein the first segment further includes a second reference plane layer and the via extends through the second reference plane layer, the first segment further including a third clearance around the via at the second reference plane layer, the third clearance having generally the same size as the second clearance.

10. The circuit board of claim 1, wherein the first segment has dielectric layers each with a first thickness, and the second segment has dielectric layers each with a second thickness, the first thickness being smaller than the second thickness.

11. The circuit board of claim 1, wherein the plurality of segments further comprise a third segment having a plurality of signal layers, wherein the first segment is provided between the second and third segments, and wherein the second segment has an outer surface, the circuit board further comprising:
   active devices mounted on the outer surface of the second segment; and
   active devices provided between the first and second segments.

12. The circuit board of claim 1, further comprising:
   a first via extending through layers of the first segment but not into the second segment; and
   a second via extending through layers of the first and second segments.

* * * * *